US012276094B2

(12) United States Patent
Veros et al.

(10) Patent No.: US 12,276,094 B2
(45) Date of Patent: Apr. 15, 2025

(54) CAPACITIVE SENSING FAUCET

(71) Applicants: Delta Faucet Company, Indianapolis, IN (US); Michael J. Veros, Carmel, IN (US); Kurt Judson Thomas, Indianapolis, IN (US); Randy L. Schneider, II, Carmel, IN (US)

(72) Inventors: Michael J. Veros, Carmel, IN (US); Kurt Judson Thomas, Indianapolis, IN (US); Randy L. Schneider, II, Carmel, IN (US)

(73) Assignee: Delta Faucet Company, Indianapolis, IN (US)

( * ) Notice: Subject to any disclaimer, the term of this patent is extended or adjusted under 35 U.S.C. 154(b) by 748 days.

(21) Appl. No.: 17/276,007

(22) PCT Filed: Sep. 16, 2019

(86) PCT No.: PCT/US2019/051324
§ 371 (c)(1),
(2) Date: Mar. 12, 2021

(87) PCT Pub. No.: WO2020/056420
PCT Pub. Date: Mar. 19, 2020

(65) Prior Publication Data
US 2022/0042291 A1    Feb. 10, 2022

Related U.S. Application Data

(60) Provisional application No. 62/731,743, filed on Sep. 14, 2018.

(51) Int. Cl.
*E03C 1/05*   (2006.01)
*H03K 17/96*  (2006.01)

(52) U.S. Cl.
CPC ........... *E03C 1/057* (2013.01); *H03K 17/962* (2013.01)

(58) Field of Classification Search
CPC ........ E03C 1/057; E03C 1/055; E03C 1/0404; A61H 33/6052
(Continued)

(56) References Cited

U.S. PATENT DOCUMENTS

| 6,962,168 B2 | 11/2005 | McDaniel et al. |
| 7,150,293 B2 | 12/2006 | Jonte |

(Continued)

FOREIGN PATENT DOCUMENTS

| CN | 101952521 A | 1/2011 |
| CN | 105005377 A | 10/2015 |

(Continued)

OTHER PUBLICATIONS

International Search Report and Written Opinion received for PCT Patent Application No. PCT/US2019/051324, mailed on Jan. 9, 2020, 11 pages.

*Primary Examiner* — Erin Deery
*Assistant Examiner* — William R Klotz
(74) *Attorney, Agent, or Firm* — Bose McKinney & Evans LLP (57) ABSTRACT

An electronic faucet including a first touch sensing area and a second touch sensing area, wherein an electrically operable valve is selectively controlled in response to certain touch protocols, such as tapping and/or grabbing the first touch sensing area and the second touch sensing area.

21 Claims, 7 Drawing Sheets

(58) Field of Classification Search
USPC .......................................................... 4/678
See application file for complete search history.

(56) References Cited

U.S. PATENT DOCUMENTS

| | | | |
|---|---|---|---|
| 7,690,395 | B2 | 4/2010 | Jonte et al. |
| 7,997,301 | B2 | 8/2011 | Marty et al. |
| 8,127,782 | B2 | 3/2012 | Jonte et al. |
| 8,528,579 | B2 | 9/2013 | Jonte et al. |
| 8,613,419 | B2 | 12/2013 | Rodenbeck et al. |
| 9,243,391 | B2 | 1/2016 | Jonte et al. |
| 9,243,392 | B2 | 1/2016 | Marty et al. |
| 9,702,128 | B2 * | 7/2017 | Sawaski ................... E03C 1/057 |
| 9,856,634 | B2 * | 1/2018 | Rodenbeck ............. E03C 1/057 |
| 10,301,801 | B2 * | 5/2019 | Sawaski ................ E03C 1/0412 |
| 2005/0047143 | A1 | 3/2005 | Currie |
| 2005/0150556 | A1* | 7/2005 | Jonte ...................... E03C 1/057 |
| | | | 137/613 |
| 2006/0186215 | A1* | 8/2006 | Logan ..................... E03C 1/055 |
| | | | 236/12.2 |
| 2007/0157978 | A1 | 7/2007 | Jonte et al. |
| 2007/0246550 | A1 | 10/2007 | Rodenbeck et al. |
| 2010/0170570 | A1 | 7/2010 | Rodenbeck et al. |
| 2014/0109984 | A1 | 4/2014 | Rodenbeck et al. |
| 2016/0024766 | A1 | 1/2016 | Sawaski et al. |
| 2019/0292757 | A1* | 9/2019 | Sawaski .................. E03C 1/057 |
| 2020/0299941 | A1* | 9/2020 | Veros ...................... G10L 15/22 |

FOREIGN PATENT DOCUMENTS

| | | |
|---|---|---|
| CN | 105051436 A | 11/2015 |
| CN | 106015700 A | 10/2016 |
| CN | 205938078 U | 2/2017 |
| TW | 201734348 A | 10/2017 |
| WO | 2008088534 A2 | 7/2008 |
| WO | 2009075858 A1 | 6/2009 |

* cited by examiner

CAPACITIVE SENSING FAUCET

CROSS-REFERENCE TO RELATED APPLICATION

The present application is a 371 U.S. National Phase of PCT International Application No. PCT/US2019/051324, filed Sep. 16, 2019, which claims priority to U.S. Provisional Patent Application Ser. No. 62/731,743, filed Sep. 14, 2018, the disclosures of which are expressly incorporated herein by reference.

BACKGROUND AND SUMMARY OF THE DISCLOSURE

The present disclosure relates generally to fluid delivery devices and, more particularly, to a capacitive sensing faucet with no manual valve handle.

The present invention provides a method for controlling temperature and flow rate of a faucet using touches on various areas of the faucet to control a creation of unique aesthetic designs that do not require handles, levers or knobs.

Illustratively, a faucet includes an electronic proportioning valve (EPV) located under a sink deck for regulating water temperature and flow. The EPV illustratively receives electronic communications from the spout to control the water.

The faucet illustratively includes electronics for capacitive sensing. In the illustrative embodiment, two sensors monitor the upper spout and lower hub which are not directly capacitively coupled. An array of LED's may be included in the spout and operated by the electronics to aid operation of the faucet by providing feedback of flow and temperature setpoints as well as actual water temperature and indications of special modes.

Capacitive sensing could be done by the EPV allowing for elimination of electronics within the spout.

In one illustrative embodiment, the faucet is divided into two zones or sensing areas coupled to the capacitive sensors: upper spout and lower hub. However, it should be appreciated that the number and positioning of the sensing areas may vary. In an illustrative embodiment, water control may be achieved as follows:

Single tap on spout turns water on/off.
Single tap on hub cycles the water temperature through a plurality of settings (110 F, 100 F, 90 F, full cold).
Double tap on spout cycles the flow rate through a plurality of settings (1.5 gpm, 1.0 gpm, 0.5 gpm).
Touch and hold (grab) on the hub slowly decreases the flow rate; user releases when desired flow rate is achieved.
Touch and hold (grab) on the spout will produce no change as this action is done to rotate the spout over the sink.

Other touch protocols, including various combinations of touches and grabs (e.g., grab spout, double tap hub, etc.), may be defined for other faucet related tasks. For example, other touch protocols may define advanced settings (cleaning mode, warm up water, dispense 2 cups of water, etc.). In an illustrative embodiment, a touch sequence may place the faucet into a programming mode where a user can set touch protocols, and/or default water flow rate and temperature. Customization of the faucet may also occur remotely, for example wirelessly via a mobile electronic device or webpage. For example, a user may remotely change the touch protocols (e.g., tap sequences) to different configurations.

Illustratively, if water is turned off and back on within some fixed duration such as five minutes, the previously used settings will be retained. If it has been longer than the fixed duration since last use, the settings may revert to default settings that may be customizable by the user.

According to an illustrative embodiment of the present disclosure, a faucet includes a spout, a hub supporting the spout, a passageway that conducts fluid to flow through the spout, and an electrically operable valve configured to supply fluid through the passageway. A first touch sensing area is defined by the spout, and a second touch sensing area is defined by the hub. At least one capacitive sensor is operably coupled to the first touch sensing area and the second touch sensing area, the at least one capacitive sensor providing an output signal. A controller is operably coupled to the electrically operable valve and to the at least one capacitive sensor. The controller is configured to monitor the output signal from the at least one capacitive sensor and to distinguish between a user tap of the first touch sensing area of the spout, a user tap of the second touch area of the hub, a user grab of the second touch sensing area of the spout, and a user grab of the second sensing area of the hub. The controller is configured to control the electrically operable valve in response to the output signal from the at least one capacitive sensor.

According to another illustrative embodiment of the present disclosure, a faucet includes a dispensing outlet, an electrically operable valve configured to supply fluid to the dispensing outlet, a first touch sensing area, and a second touch sensing area in spaced relation to the first touch sensing area. At least one capacitive sensor is operably coupled to the first touch sensing area and the second touch sensing area, the at least one capacitive sensor providing an output signal. A controller is operably coupled to the electrically operable valve and to the at least one capacitive sensor, the controller configured to monitor the output signal from the at least one capacitive sensor and to distinguish between a user tap of the first touch sensing area, a user tap of the second touch sensing area, a user grab of the first touch sensing area, and a user grab of the second touch sensing area. The controller is configured to control the electrically operable valve in response to the output signal from the at least one capacitive sensor. A user tap is defined as a user touch of at least one of the first sensing area and the second sensing area having a duration of between 60 msec and 300 msec, and a user grab is defined as a user touch of at least one of the first sensing area and the second sensing area having a duration of greater than 300 msec.

According to another illustrative embodiment of the present disclosure, a faucet includes a dispensing outlet, an electrically operable valve configured to supply fluid to the dispensing outlet, a first touch sensing area, and a second touch sensing area in spaced relation to the first touch sensing area. At least one capacitive sensor is operably coupled to the first touch sensing area and the second touch sensing area, the at least one capacitive sensor providing an output signal. A controller is operably coupled to the electrically operable valve and to the at least one capacitive sensor, the controller configured to control the electrically operable valve in response to the output signal from the at least one capacitive sensor. A flow sensor is fluidly coupled to the electrically operable valve and is in communication with the controller, the flow sensor configured to sense water flow rate and provide a signal indicative of sensed water flow rate to the controller. A temperature sensor is fluidly coupled to the electrically operable valve and is in communication with the controller, the temperature sensor configured to sense water temperature and provide a signal indicative of sensed water temperature to the controller. A plurality of light emitters are operably coupled to the controller, wherein a first mode of the plurality of light emitters provide an indication of at least one of sensed water flow rate and sensed water temperature, and a second mode of the plurality of light emitters provides an indication of a setpoint value of at least one of water flow rate and water temperature. Illustratively, the first mode of the plurality of light emitters includes steady illumination of at least one of the light emitters providing an indication of the at least one of sensed water flow rate and sensed water temperature, and the second mode of the plurality of light emitters includes flashing illumination of at least one of the light emitters providing an indication of the setpoint value of the at least one of water flow rate and water temperature.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

For the purposes of promoting and understanding of the principles of the present disclosure, reference will now be made to the embodiments illustrated in the drawings, which are described herein.

Figure 1:
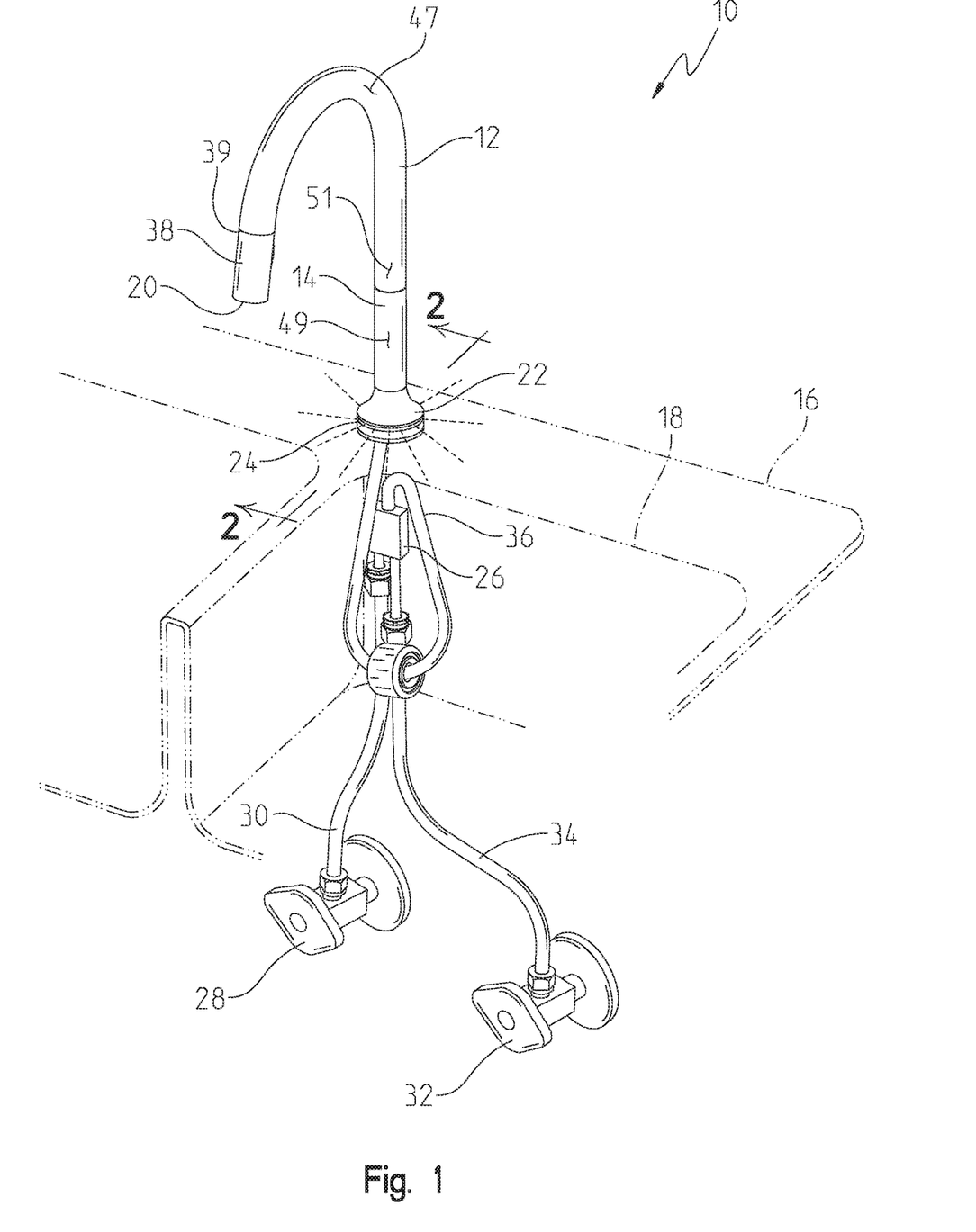
FIG. 1 is a perspective view of an illustrative electronic faucet of the present disclosure shown mounted to a sink deck.
Figure 2:
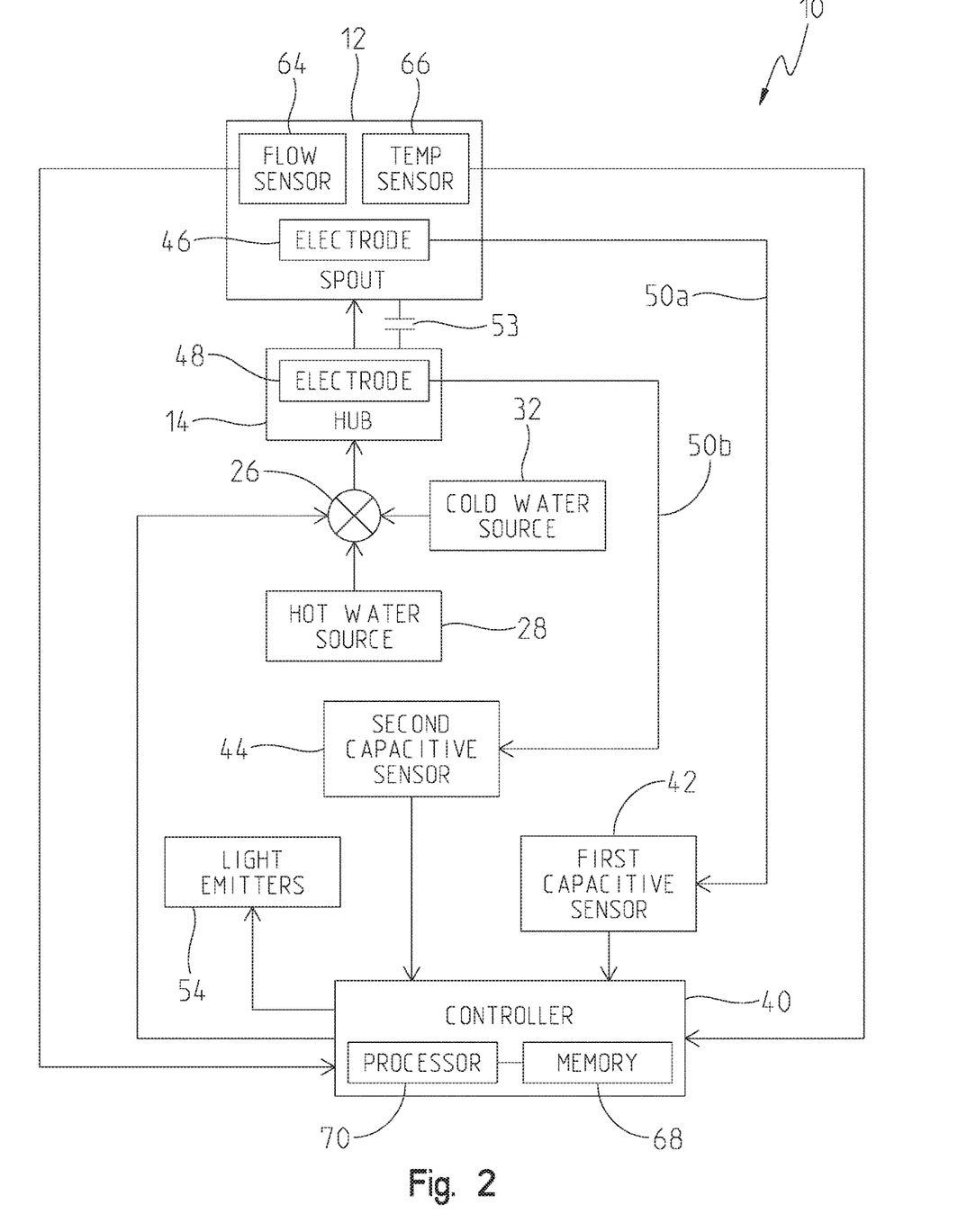
FIG. 2 is a block diagram of the electronic faucet of FIG. 1.

Referring initially to FIGS. 1 and 2, an illustrative electronic faucet 10 of the present disclosure includes a delivery spout 12 supported by a hub 14. The hub 14 is configured to be supported by a mounting deck, such as a sink deck 16 supporting a sink basin 18. A dispensing outlet 20 is defined by the delivery spout 12 and is configured to dispense water into the sink basin 18. A base 22 may be disposed below the hub 14 and illustratively includes a light indicator 24. It may be appreciated that the base 22 may be a separate component from the hub 14, or be formed integral therewith. Further, the light indicator 24 may be positioned anywhere on the faucet 10 or even on the adjacent sink deck 16.

An electrically operable valve 26 is illustratively positioned below the sink deck 16 and is fluidly coupled to a hot water source 28 via a flexible hot water supply tube 30, and to a cold water source 32 via a flexible cold water supply tube 34. An outlet tube 36 is fluidly coupled to the electrically operable valve 26 and extends through the delivery spout 12. The outlet tube 36 is illustratively flexible, and may be fluidly coupled to a pulldown sprayhead 38 removably coupled to an outlet end 39 of the spout 12.

Illustratively, the electrically operable valve 26 may be an electronic proportioning valve configured to control the flow rate and the temperature of water supplied from the water sources 28 and 32 to the outlet tube 36 in fluid communication with the dispensing outlet 20. An illustrative electrically operable valve 26 may be a solenoid valve of the type detailed in U.S. Pat. No. 9,458,612, the disclosure of which is expressly incorporated herein by reference.

In the illustrative embodiment of FIGS. 1 and 2, the hot water source 28 and the cold water source 32 are fluidly coupled directly to the electrically operable valve 26 to provide a fully automatic faucet 10 without any manual controls. In certain other illustrative embodiments, a separate manual valve assembly with at least one manual valve handle (not shown) may be provided in series with the electrically operable valve 26. In such an illustrative embodiment, the manual valve assembly may control flow rate and/or water temperature independently from the electrically operable valve 26.

The electrically operable valve 26 is illustratively controlled by input signals from a controller 40. Because the electrically operable valve 26 is controlled electronically by controller 40, the flow of water can be controlled using outputs from sensors, illustratively first and second capacitive sensors 42 and 44 as further discussed herein. Illustratively, the controller 40 may be integrated with the electrically operable valve 26, or be spaced apart and in communication with the electrically operable valve 26 via wired or wireless communication.

Illustratively, a first touch sensor electrode 46 is electrically coupled to the delivery spout 12, while a second touch sensor electrode 48 is electrically coupled to the hub 14. The spout 12 is illustratively at least partially made from a conductive material to form the first touch sensor electrode 46. Similarly, the hub 14 is at least partially formed from a conductive material to form the second touch sensor electrode 48. The first touch sensor electrode 46 defines a first touch sensing area 47 on the delivery spout 12, while the second touch sensor electrode 48 defines a second touch sensing area 49 on the hub 14. It should be appreciated that the number and location of touch sensor electrodes and touch sensing areas may vary, for example, to provide dedicated touch points or area related to advanced features, such as dispensing measured volumes. For example, multiple capacitively isolated touch sensing areas 47, 49 may be provided on each of the delivery spout 12 and the hub 14. In other illustrative embodiments, one or more touch sensing areas 47, 49 may be defined on the sprayhead 38, alone or together with touch sensing areas on the spout 12 and the hub 14. In one illustrative embodiment, a third touch sensing area 51 may be located between the first touch sensing area 47 on the delivery spout 12 and the second touch sensing area 49 on the hub 14. This third touch sensing area 51 may be dedicated to control flow (via taps and grabs as further defined herein).

Illustratively, the first electrode 46 is directly coupled to the first capacitive sensor 42 of controller 40, and the second electrode 48 is directly coupled to the second capacitive sensor 44 of controller 40. In the illustrative embodiment of FIG. 1, wires 50a and 50b may be used to connect the first electrode 46 to the first capacitive sensor 42, and the second electrode 48 to the second capacitive sensor 44. In such an illustrative embodiment, an electrical insulator 53 may be positioned intermediate the spout 12 and the hub 14 so that they are not capacitively coupled together. In other illustrative embodiments, the electrode 46 of spout 12 may be capacitively coupled to the electrode 48 of the hub 14. An illustrative capacitive coupling arrangement between faucet components is shown in U.S. Pat. No. 8,613,419, the disclosure of which is expressly incorporated herein by reference.

It is understood that any conventional capacitive sensor may be used in accordance with the present invention. See, for example, U.S. Pat. No. 6,962,168 which is expressly incorporated herein by reference.

Figure 3:
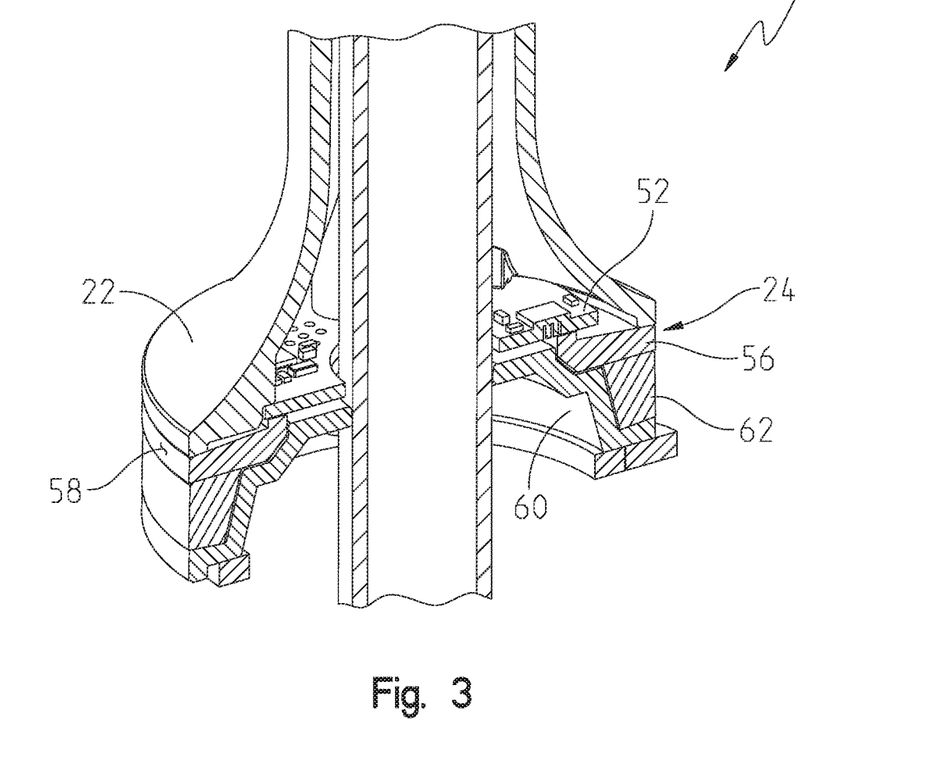
FIG. 3 is a partial perspective view, in cross-section, of the electronic faucet of FIG. 1.
Figure 4:
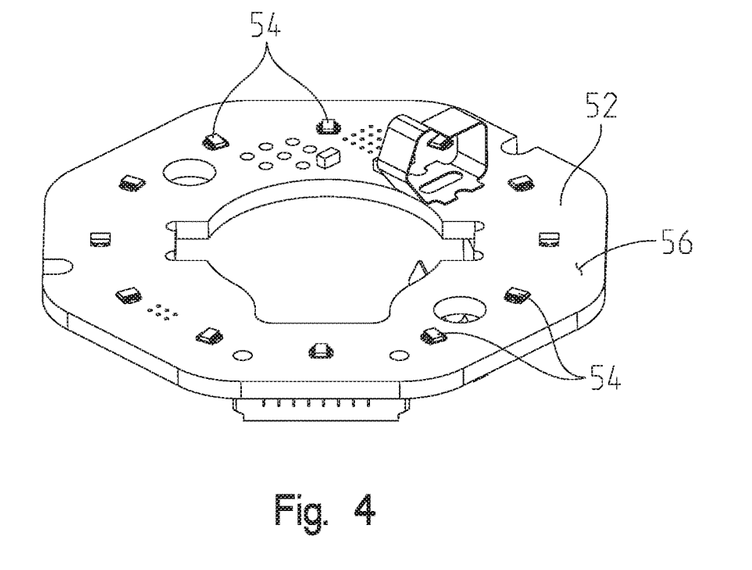
FIG. 4 is a perspective view of an illustrative circuit board of the electronic faucet of FIG. 3.
Figure 5A:
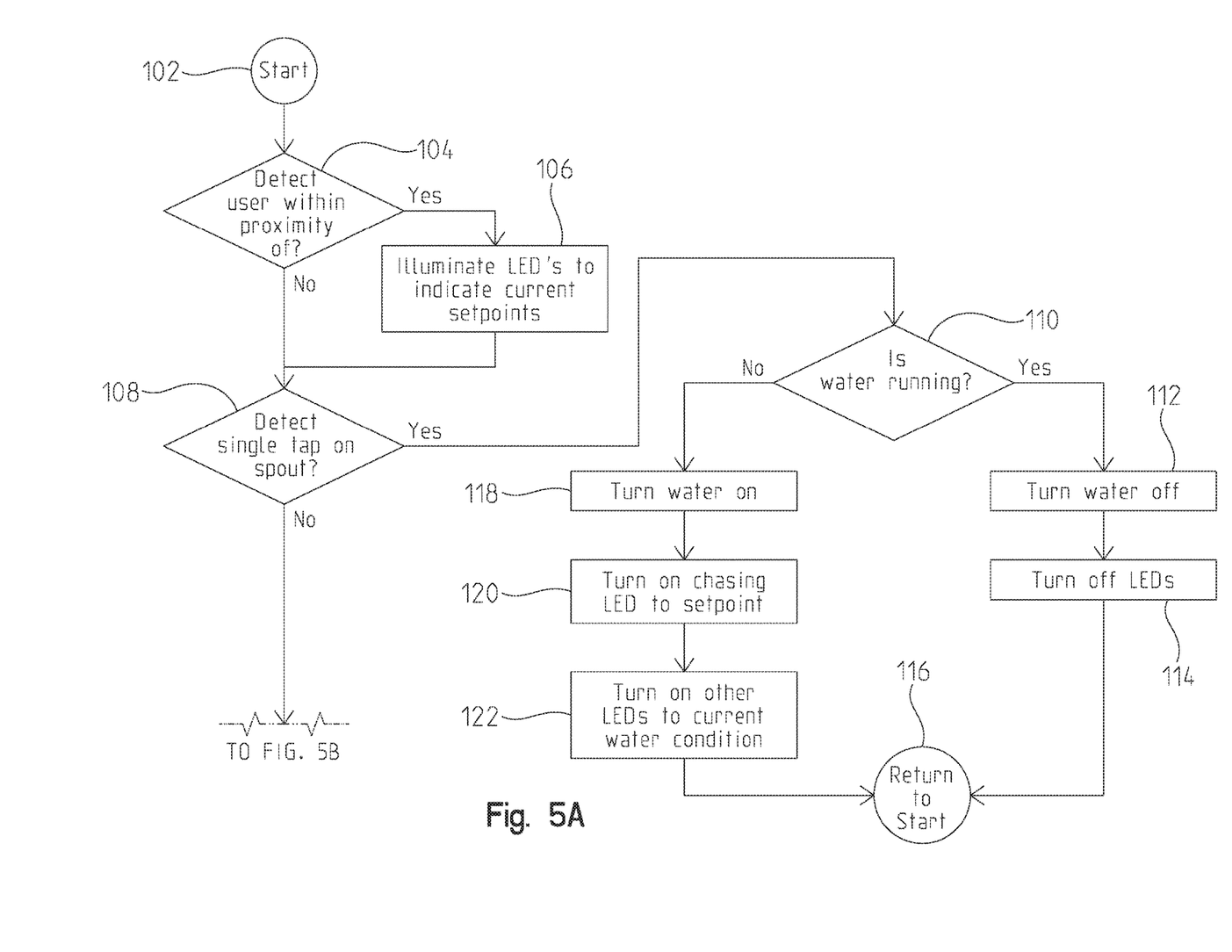
FIGS. 5A-5D are flow charts of an illustrative operation of the electronic faucet of FIG. 1.
Figure 5B:
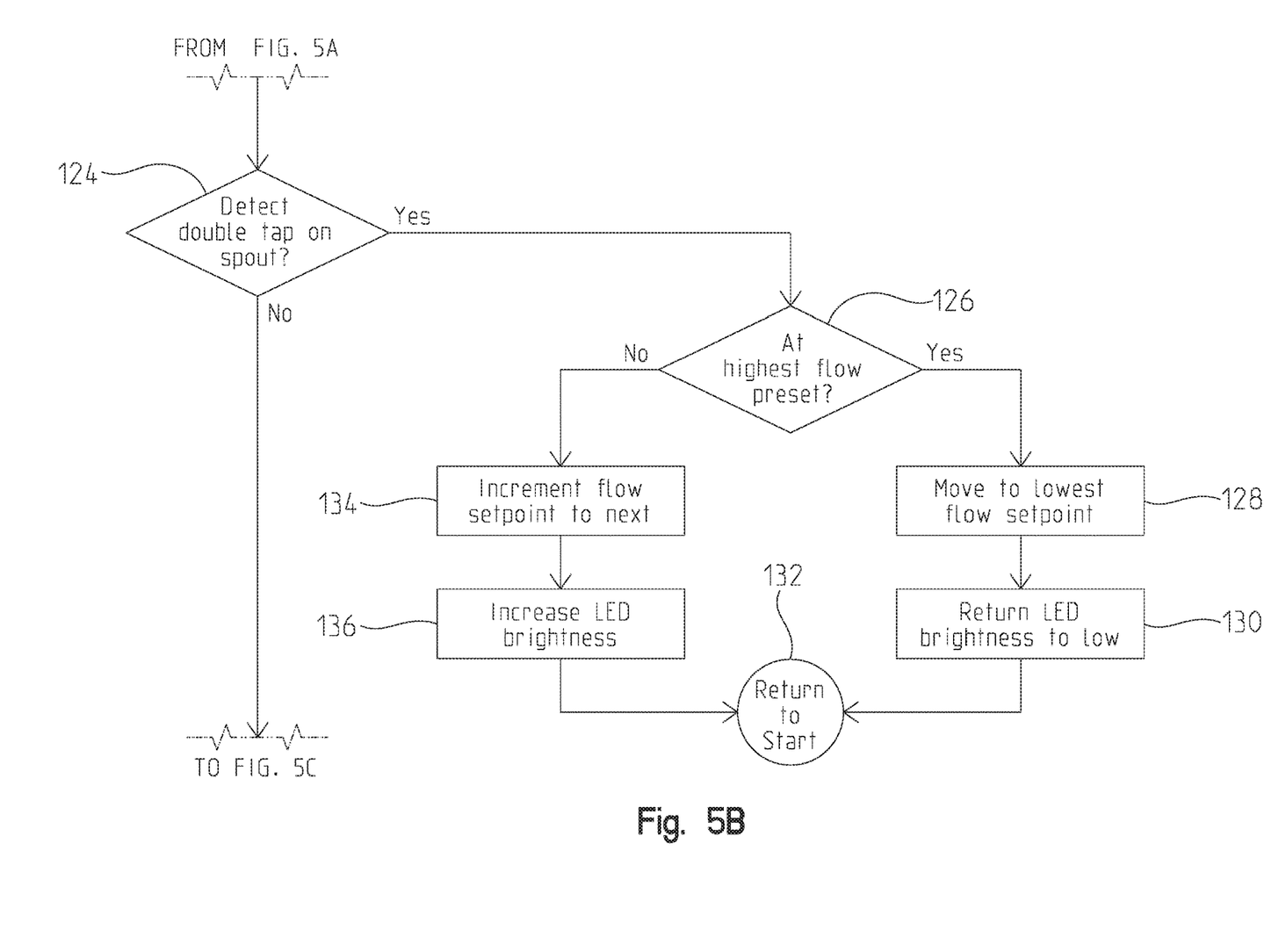
Figure 5C:
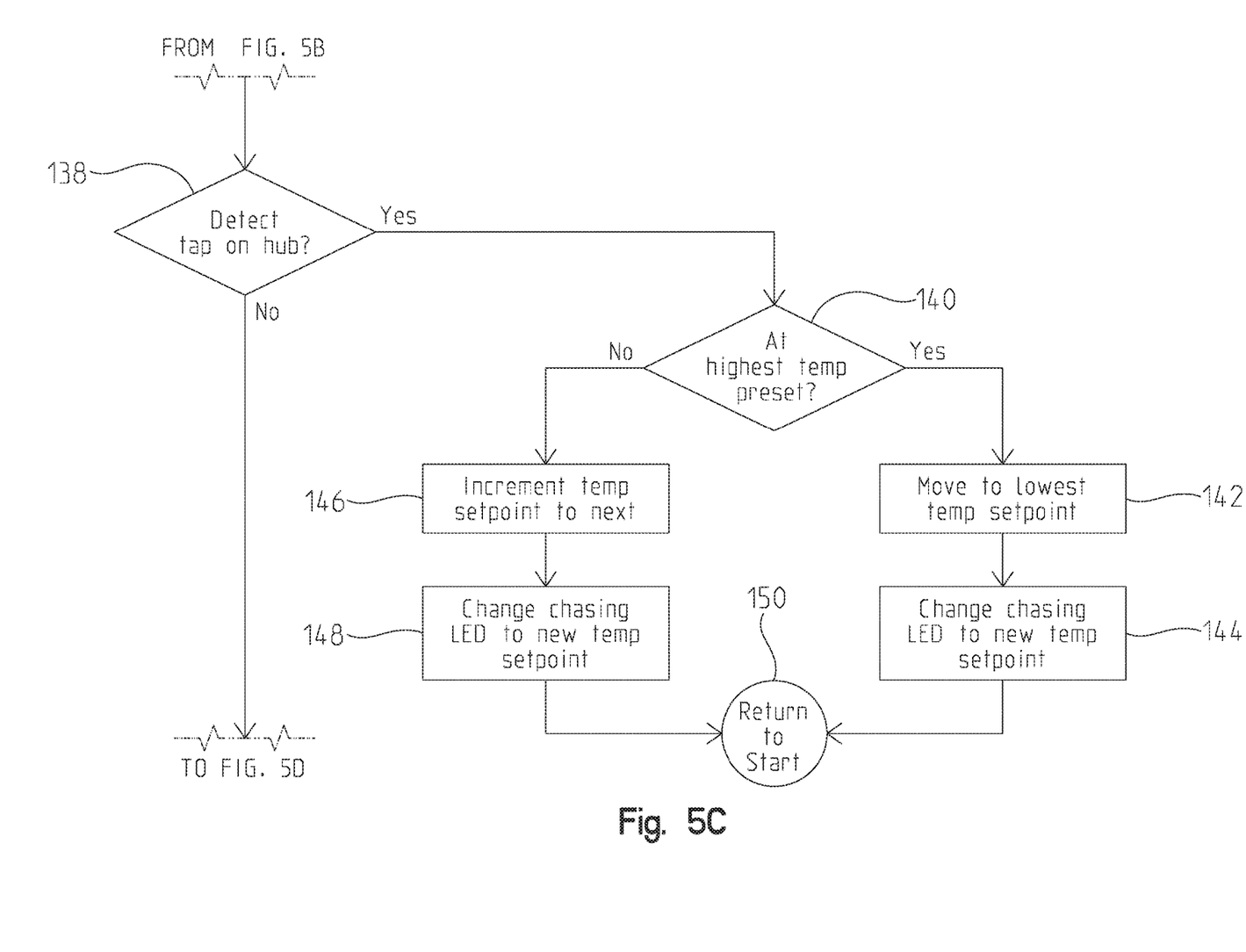
Figure 5D:
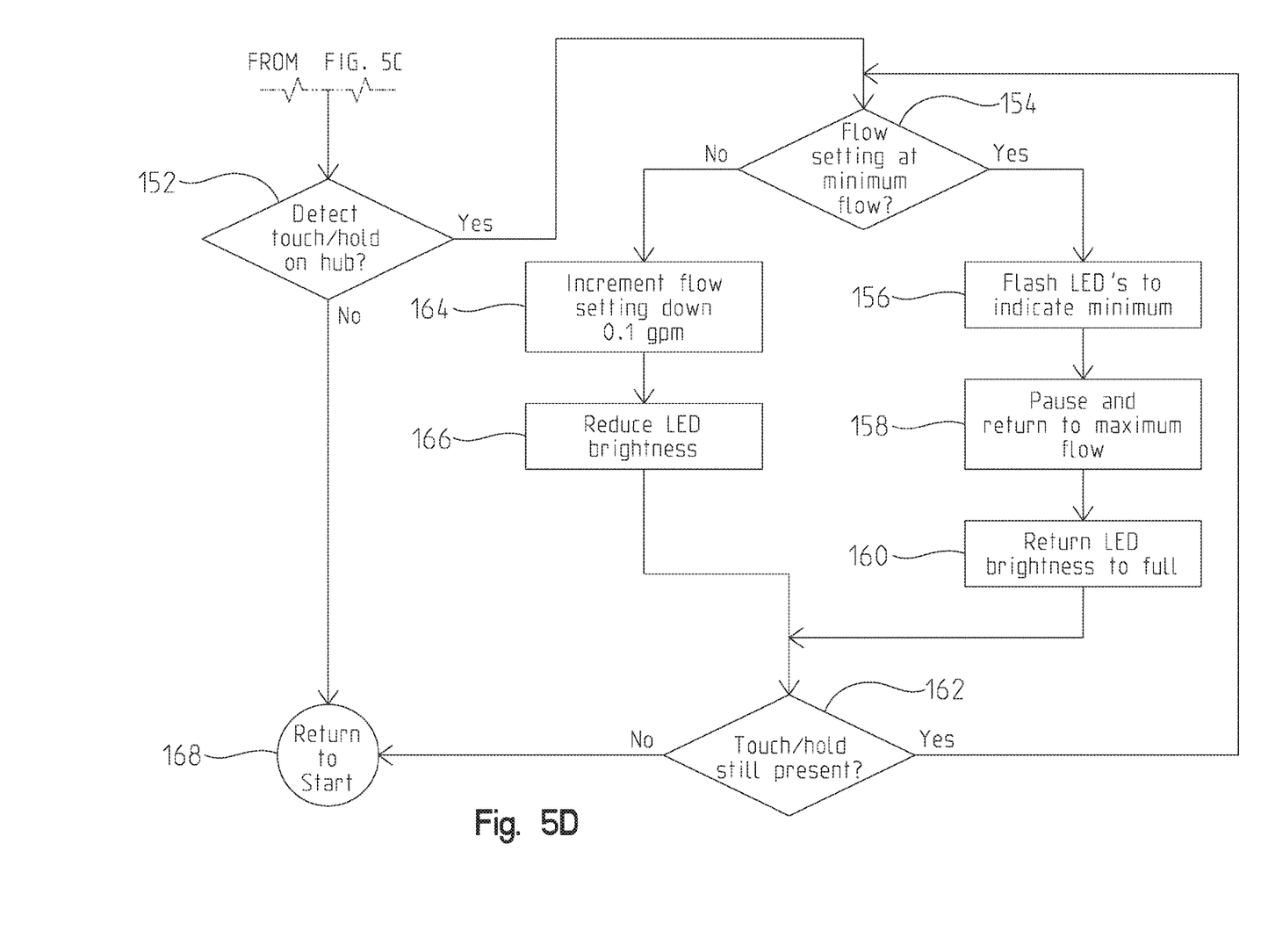

With reference to FIGS. 3 and 4, the light indicator 24 of the base 22 illustratively includes a substrate 52 (e.g., a printed circuit board) that supports a plurality of circumferentially spaced apart light emitters 54. The light emitters 54 illustratively comprise multi-color light emitting diodes (LEDs) and, more particularly, tri-color (red, green and blue) LEDs. In one illustrative embodiment, twelve different LEDs are arranged (i.e., circumferentially spaced) in an annular ring on the substrate 52. As such, there are thirty-six different pixels positioned in the illustrative annular ring.

As shown in FIGS. 3 and 4, the light emitters 54 are supported on a lower surface 55 of the substrate 52 such that light is directed downwardly. A lens or light pipe 56 diffuses and transmits light from the light emitters 54 radially outwardly to an outer surface 58. The lens 56 is illustratively formed of a translucent polymer, such as an acrylic. The base 22 further includes a base support or stand 60 and a spacer 62 supporting the lens and substrate.

As further detailed herein, the light emitters 54 may be operated by the controller 40 to provide feedback of flow and temperature setpoints, as well as actual water temperature and indications of special modes. As such, a water flow sensor 64 and/or a water temperature sensor 66 may be provided to detect the flow rate and/or temperature of water supplied to the discharge outlet 20 and provide signals indicative thereof to the controller 40. In an illustrative embodiment, some or a first set of the light emitters 54 (illustratively three of twelve LEDs) may indicate setpoint water temperature. These light emitters 54 may be solid (steady illumination), flashing or chasing (providing an appearance of light rotating circumferentially (e.g., in a circle)). In this illustrative embodiment, the remaining or a second set of light emitters 54 (illustratively nine of twelve LEDs) may indicate the actual or sensed water temperature from the temperature sensor 66 and are solid (steady illumination). Illustratively, the brightness or intensity of the light emitters 54 may indicate water flow rate, both setpoint and sensed, in a manner similar to the water temperature including the first and second sets of light emitters 54, respectively. During dispensing of water from the faucet 10, the light emitters 54 may provide a countdown to completion of a quantity of water dispensed instead of showing setpoint and actual water temperature.

The following is a description of algorithms used by the controller 40 to process "touch" conditions of two electrodes 46 and 48 which are capacitively coupled to first and second capacitive sensors 42 and 44 which detects changes in electrical capacitance. The interpretation of how and when the electrodes 46 and 48 are touched is used to determine when to actuate the electrically operable valve 26. The algorithms are illustratively stored on machine readable media (i.e., software) within a memory 68 and processed by the processor 70 of the controller 40. The processor 70 illustratively includes an internal clock or timer.

It should be appreciated that the method and apparatus detailed herein may be used in connection with the faucet disclosed in PCT International Patent Application Publication No. WO 2008/088534, and U.S. Patent Application Publication No. 2007/0157978, the disclosures of which are expressly incorporated herein by reference.

An illustrative embodiment of detection algorithms, stored in the memory 68 and executed by the processor 70 of the controller 40, for distinguishing between proximity and touch, and between short taps and longer grabs of the spout 12 or hub 14, for example, will be described first. The following definitions are used in the first example of the detection algorithm. Proximity is defined a capacitive measurement above a proximity threshold value. A "tap" is a touch of short duration designed to turn the water or fluid on or off. More particularly, a "tap" is illustratively defined as a capacitive measurement above a touch threshold value for a minimum of 60 msec and a maximum of 300 msec. The touch threshold value is greater than the proximity threshold value. A "double tap" is illustratively defined as successive taps with a maximum duration between taps of 300 msec. More particularly, the double tap algorithm waits a maximum duration between taps of 300 msec. Every time a tap occurs, the timer of the processor 70 is reset to 0 and waits up to 300 msec to see if a subsequent tap occurs.

A "grab" (or "touch/hold") is a touch of a longer duration such as when a user grasps the spout 12 to move the spout from one area of the sink basin to another or when the user grasps and holds the hub. More particularly, a "grab" is illustratively defined as a capacitive measurement above the touch threshold value for longer than 300 msec. Additional details regarding illustrative capacitive proximity and touch thresholds are detailed in U.S. Pat. No. 8,561,626, the disclosure of which is expressly incorporated herein by reference.

With reference to FIGS. 5A-5D, an illustrative method of operating the electronic faucet 10 begins at block 102. At decision block 104, if the controller 40 detects a user within proximity of the faucet 10 via either capacitive sensor 42, 44, then the light emitters 54 are illuminated to indicate current setpoints (e.g., low, medium or high for both water flow rate and water temperature). For example, light intensity could represent water flow rate and light color could represent water temperature. As such, proximity sensing may be used to turn on the LED ring to indicate the current settings before water is turned on. This provides a visual reference since there is no handle to provide this feedback. Optionally, the light emitters 54 could always be lit with a representation of the setpoint when not in use if power consumption is not an issue.

The method then continues to decision block 108, where the controller 40 determines whether a single tap on the spout 12 has been detected. If so, then the method continues to decision block 110 where the controller 40 determines if water is flowing (either via feedback from the electrically operable valve 26 regarding its position, or from the flow sensor 64). If the water is running, then the method continues to block 112 where the controller 40 turns off the water by closing the electrically operable valve 26. At block 114, the controller 40 turns off the light emitters 54. At block 116, the method then returns to the start block 102.

Returning to block 110, if the water is not running, then at block 118 the controller 40 turns on the water by opening the electrically operable valve 26. At block 120, the controller 40 turns on the light emitters 54 in a chasing pattern (where at least some of the light emitters 54 flash successively in a circumferential arrangement) to define the setpoint. Next, the controller activates the light emitters to provide an indication of current or sensed water conditions (e.g., water flow rate and/or water temperature which may be measured by the flow sensor 64 and the temperature sensor 66, respectively). At block 116, the method then returns to the start block 102.

Returning to block 108, if a single tap on the spout 12 is not detected, then at block 124 then the controller 40 determines if a double tap on the spout 12 is detected by the capacitive sensors. If so, then the method continues to block 126, where the controller 40 determines if the setpoint is at a highest flow preset. Illustratively, the highest flow preset or setpoint is 1.4 gallons per minute (gpm). If at the highest flow preset, then the controller 40 opens the valve 26 to the lowest flow setpoint at block 128. Illustratively, the lowest flow preset or setpoint is 0.4 gallons per minute (gpm). At block 130, the controller 40 sets the light emitter brightness to low to associate with the low flow rate. At block 132, the method then returns to the start block 102.

Returning to block 126, if the controller 40 determines that the setpoint is not at the highest flow preset, then the flow is incremented to the next highest setpoint at block 134. Illustratively, the flow preset values or setpoints are low at 0.4 gallons per minute (gpm), medium at 0.8 gallons per minute (gpm) and high at 1.4 gallons per minute (gpm). It should be appreciated that these setpoints may vary and could be configured by the user. At block 136, the controller 40 increases the brightness of the light emitters 54 to associate with the higher flow rate. At block 132, the method then returns to the start block 102.

Returning to block 124, if no double tap on the spout 12 is detected, then the method continues to block 138 where the controller 40 determines whether a tap on the hub 14 is detected. If so, then the method continues to block 140 where the controller 40 determines if the setpoint is at a highest temperature preset. Illustratively, the highest temperature preset or setpoint is 110 degrees Fahrenheit (F). If so, then the controller 40 operates the valve 26 to its lowest temperature setpoint at block 142. Illustratively, the lowest temperature preset or setpoint is 60 degrees Fahrenheit (F) or full cold. At block 144, the controller 40 operates the light emitters 54 to a chasing pattern (where at least some of the light emitters 54 flash successively in a circumferential arrangement) representing the new temperature setpoint. The light emitters 54 may also provide a color indication of the new temperature setpoint, where blue represents cold, purple represents medium, and red represents hot. At block 150, the method then returns to the start block 102.

With reference again to block 140, if the controller 40 determines that the setpoint is not at the lowest temperature preset, then the controller 40 increments the valve to operate at the next highest temperature setpoint at block 146. Illustratively, the temperature preset values or setpoints are cold at 60 degrees Fahrenheit (F), warm at 95 degrees Fahrenheit (F), and hot at 110 degrees Fahrenheit (F). It should be appreciated that these setpoints may vary and could be configured by the user. At block 148, the controller 40 operates the light emitters 54 to the light emitters 54 to a chasing pattern (where at least some of the light emitters 54 flash successively in a circumferential arrangement) representing the new temperature setpoint. The light emitters 54 may also provide a color indication of the new temperature setpoint, where blue represents cold, purple represents medium, and red represents hot. At block 150, the method then returns to the start block 102.

If no tap is detected on the hub 14 at block 138, then the method continues to block 152 where it is determined if a touch/hold (i.e., grab) is detected on the hub 14. If so, then the method continues to block 154 where the controller 40 determines if the flow setting is at a minimum value. If so, then the method continues to block 156 where the light emitters 54 are flashed to indicate such minimum flow. At block 158, the controller 40 pauses flow and then returns flow to a maximum value. At block 160, the controller 40 returns the light emitter brightness to full. At block 162, the controller 40 determines if a touch/hold on the hub 14 is still present. If yes, then the method returns to block 154. If not, then the method proceeds to block 168, where it returns to start block 102.

Returning to block 154, if the controller 40 determines that the flow setting is not at a minimum value, then the method continues to block 164 where the flow setting is incremented down by 0.1 gallons per minute (gpm). At block 166, the controller 40 reduces brightness of the light emitters 54 and then continues to block 162.

It should be appreciated that the faucet 10 is not limited to the touch protocols detailed above. More particularly, additional touch protocols, including various combinations of touches and grabs (e.g., grab spout, double tap hub, etc.), may be defined for more other faucet related tasks. Additional illustrative touch protocols include:

Grab hub 14 and tap spout 12 wherein the number of taps determine volume dispensed (e.g., 3 taps dispenses 3 cups of water).

Grab spout 12 (lights up one-half of light ring), grab hub 14 (light up other half of light ring) for several seconds puts the faucet 10 into "cleaning mode" or "vacation mode" where capacitive sensing is ignored except for the same routine to reverse it. LED indication is optional. Cleaning mode would exit automatically after 5-10 minutes.

Grab spout 12 and triple tap the hub 14 to enter programming mode; set temp and flow; repeat the grab and triple tap to exit (or it times out after 20 seconds).

Grab hub 14 and double/triple tap the spout 12 to initiate warm-up feature (water runs until it gets to 95 F and then turns off).

It should be appreciated that the illustrative electronic faucet facilitates control of water temperature and flow rate by touching faucet components, thereby allowing for unique aesthetic designs that do not require handles, levers or knobs. Additionally, the electronic faucet permits for symmetrical input from either side of the faucet by either right-handed or left-handed users.

Although the invention has been described in detail with reference to certain preferred embodiments, variations and modifications exist within the spirit and scope of the invention as described and defined in the following claims.

The invention claimed is:

1. A faucet comprising:
a spout at least partially formed by conductive material;
a hub supporting the spout wherein the hub is at least partially formed by conductive material;
a passageway that conducts fluid flow through the spout;
an electrically operable valve configured to regulate fluid temperature and flow through the passageway;
wherein the spout forms a first touch sensing area;
wherein the hub forms a second touch sensing area;
at least one capacitive sensor operably coupled to the first touch sensing area and the second touch sensing area, the at least one capacitive sensor providing an output signal; and
a controller operably coupled to the electrically operable valve and to the at least one capacitive sensor, the controller configured to monitor the output signal from the at least one capacitive sensor and to distinguish between a user tap of the first touch sensing area of the spout, a user tap of the second touch sensing area of the hub, a user grab of the first touch sensing area of the spout, and a user grab of the second touch sensing area of the hub; the controller configured to start a timer after detecting a tap and determine if a second tap occurs within a predefined time limit to thereby identify the occurrence of a double tap of at least one of the first touch sensing area of the spout and the second touch sensing area of the hub; and the controller configured to control the electrically operable valve and thereby regulate fluid temperature and flow through the passageway in response to the output signal from the at least one capacitive sensor in accordance with a protocol that distinguishes between user taps of the first touch sensing area of the spout, user taps of the second touch sensing area of the hub, user grabs of the first touch sensing area of the spout and user grabs of the second touch sensing area of the hub.

2. The faucet of claim 1, wherein the controller toggles the electrically operable valve between open and closed positions in response to detecting a user providing a single tap on the first touch sensing area of the spout.

3. The faucet of claim 1, wherein the controller operates the electrically operable valve to cycle water temperature through a plurality of settings in response to detecting a user providing a single tap on the second touch sensing area of the hub.

4. The faucet of claim 1, wherein the controller operates the electrically operable valve to cycle water flow rate through a plurality of settings in response to detecting a user providing a double tap on the first touch sensing area of the spout.

5. The faucet of claim 1, wherein the controller operates the electrically operable valve to decrease flow rate in response to detecting a user providing a grab on the second touch sensing area of the hub.

6. The faucet of claim 1, wherein the spout is rotatable and the controller does not alter the state of the electrically operable valve in response to detecting a user providing a grab on the first touch sensing area of the spout.

7. The faucet of claim 1, wherein a user tap is defined as a user touch of at least one of the first sensing area and the second sensing area having a duration of between 60 msec and 300 msec, and a user grab is defined as a user touch of at least one of the first sensing area and the second sensing area having a duration of greater than 300 msec.

8. The faucet of claim 1, further comprising a plurality of light emitters operably coupled to the controller, wherein steady illumination of at least one of the light emitters provides an indication of a measured value of a water parameter, and flashing illumination of at least one of the light emitters provides an indication of a setpoint value of a water parameter.

9. The faucet of claim 8, wherein the water parameter includes water temperature and water flow rate wherein the water temperature is indicated by light color and water flow rate is indicated by light intensity.

10. A faucet comprising:
a dispensing outlet;
an electrically operable valve configured to regulate fluid temperature and flow through the dispensing outlet;
a first touch sensing area;
a second touch sensing area in spaced relation to the first touch sensing area;
at least one capacitive sensor operably coupled to the first touch sensing area and the second touch sensing area, the at least one capacitive sensor providing an output signal; and
a controller operably coupled to the electrically operable valve and to the at least one capacitive sensor, the controller configured to monitor the output signal from the at least one capacitive sensor and to distinguish between a user tap of the first touch sensing area, a user tap of the second touch sensing area, a user grab of the first touch sensing area, and a user grab of the second touch sensing area, the controller being further configured to start a timer after detecting a tap of the first touch sensing area and determine if a second tap of the first touch sensing area occurs within a predefined time limit to thereby identify the occurrence of a double tap of the first touch sensing area, the controller configured to control the electrically operable valve and thereby regulate fluid temperature and flow through the dispensing outlet in response to the output signal from the at least one capacitive sensor in accordance with a protocol that distinguishes between user taps of the first touch sensing area of the spout, user double taps of the first touch sensing area, user taps of the second touch sensing area of the hub, user grabs of the first touch sensing area of the spout and user grabs of the second touch sensing area of the hub;
wherein a user tap is defined as a user touch of at least one of the first sensing area and the second sensing area having a duration of between 60 msec and 300 msec, a user grab is defined as a user touch of at least one of the first sensing area and the second sensing area having a duration of greater than 300 msec, and the predefined time limit used to determine if a double tap of the first touch sensing area has occurred is 300 msec;
a spout at least partially formed by conductive material and defining the dispensing outlet;
a hub at least partially formed by conductive material and supporting the spout; and
a passageway that conducts fluid flow through the spout to the dispensing outlet;
wherein the spout forms the first touch sensing area, and the hub forms the second touch sensing area.

11. The faucet of claim 10, wherein the controller toggles the electrically operable valve between open and closed positions in response to detecting a user providing a single tap on the first touch sensing area of the spout.

12. The faucet of claim 11, wherein the controller operates the electrically operable valve to cycle water temperature through a plurality of settings in response to detecting a user providing a single tap on the second touch sensing area.

13. The faucet of claim 12, wherein the controller operates the electrically operable valve to cycle water flow rate through a plurality of settings in response to detecting a user providing a double tap on the first touch sensing area.

14. The faucet of claim 12, wherein the controller operates the electrically operable valve to decrease flow rate in response to detecting a user providing a grab on the second touch sensing area.

15. The faucet of claim 12, wherein the controller does not alter the state of the electrically operable valve in response to detecting a user providing a grab on the first touch sensing area.

16. The faucet of claim 10, further comprising a plurality of light emitters operably coupled to the controller, wherein steady illumination of at least one of the light emitters provides an indication of a measured value of a water parameter, and flashing illumination of at least one of the light emitters provides an indication of a setpoint value of a water parameter.

17. The faucet of claim 16, wherein the water parameter includes water temperature and water flow rate wherein the water temperature is indicated by light color and water flow rate is indicated by light intensity.

18. The faucet of claim 1, wherein the controller is configured to include a programming mode wherein the user can define the protocol used in regulation of the fluid temperature and flow.

19. The faucet of claim 1, wherein the faucet includes a third touch sensing area disposed between the first touch sensing area and the second touch sensing area and wherein the third touch sensing area is dedicated to control the flow.

20. The faucet of claim 1, wherein turning fluid flow through the spout on and off is controlled by the first touch sensing area and regulating the fluid temperature is controlled by the second touch sensing area.

21. The faucet of claim 20, wherein a flow rate of the fluid flow through the spout is adjustable by both the first touch sensing area and the second touch sensing area.

* * * * *